(12) United States Patent  (10) Patent No.: US 8,718,413 B2
Akiyama                   (45) Date of Patent:    May 6, 2014

(54) OPTICAL MODULATION APPARATUS AND OPTICAL MODULATION/INTEGRATION APPARATUS

(75) Inventor: Suguru Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 363 days.

(21) Appl. No.: 12/894,572

(22) Filed: Sep. 30, 2010

(65) Prior Publication Data
US 2011/0103734 A1    May 5, 2011

(30) Foreign Application Priority Data

Oct. 1, 2009 (JP) ................................. 2009-229673

(51) Int. Cl.
*G02F 1/35* (2006.01)
(52) U.S. Cl.
USPC ....................................... 385/3; 385/1; 385/2
(58) Field of Classification Search
None
See application file for complete search history.

(56) References Cited

U.S. PATENT DOCUMENTS

| 6,288,823 | B1 | 9/2001 | Taylor |
| 7,321,702 | B2 | 1/2008 | Akiyama et al. |
| 2003/0161570 | A1* | 8/2003 | Paniccia .......................... 385/14 |
| 2005/0196092 | A1* | 9/2005 | Enokihara et al. ................ 385/2 |

FOREIGN PATENT DOCUMENTS

JP    2005-326548 A    11/2005

* cited by examiner

*Primary Examiner* — Uyen Chau N Le
*Assistant Examiner* — Chad Smith
(74) *Attorney, Agent, or Firm* — Fujitsu Patent Center

(57) ABSTRACT

An optical modulation apparatus includes: a substrate; a first optical waveguide and a second optical waveguide formed at an interval on the substrate; an electrode provided along at least one of the first optical waveguide and the second optical waveguide; and a power source coupled to the electrode to apply a voltage to at least one of the first optical waveguide and the second optical waveguide, wherein at least one of the first optical waveguide and the second optical waveguide includes a diffraction grating region where light having a wavelength $\lambda$ is reflected, and a phase shift region where a phase of the light is shifted by an amount in a range of 0 to $\lambda/2$.

17 Claims, 21 Drawing Sheets

OPTICAL MODULATION APPARATUS AND OPTICAL MODULATION/INTEGRATION APPARATUS

CROSS-REFERENCE TO RELATED APPLICATIONS

This application claims the benefit of priority from Japanese Patent Application No. 2009-229673 filed on Oct. 1, 2009, the entire contents of which are incorporated herein by reference.

BACKGROUND

1. Field

The embodiments discussed herein are related to an optical modulation apparatus and an optical modulation/integration apparatus.

2. Description of Related Art

In a Wavelength Division Multiplexing (WDM) system, an optical transmission apparatus including a distributed feedback (DFB) laser and an optical modulator may be used.

In the WDM system, an optical modulator that supports a wide wavelength band, such as a Mach-Zehnder (MZ) optical modulator, may be used.

Related art is disclosed in Japanese Laid-open Patent Publication No. 2005-326548 and U.S. Pat. No. 6,288,823.

SUMMARY

According to one aspect of the embodiments, an optical modulation apparatus includes: a substrate; a first optical waveguide and a second optical waveguide formed at an interval on the substrate; an electrode provided along at least one of the first optical waveguide and the second optical waveguide; and a power source coupled to the electrode to apply a voltage to at least one of the first optical waveguide and the second optical waveguide, wherein at least one of the first optical waveguide and the second optical waveguide includes a diffraction grating region where light having a wavelength $\lambda$ is reflected, and a phase shift region where a phase of the light is shifted by an amount in a range of 0 to $\lambda/2$.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
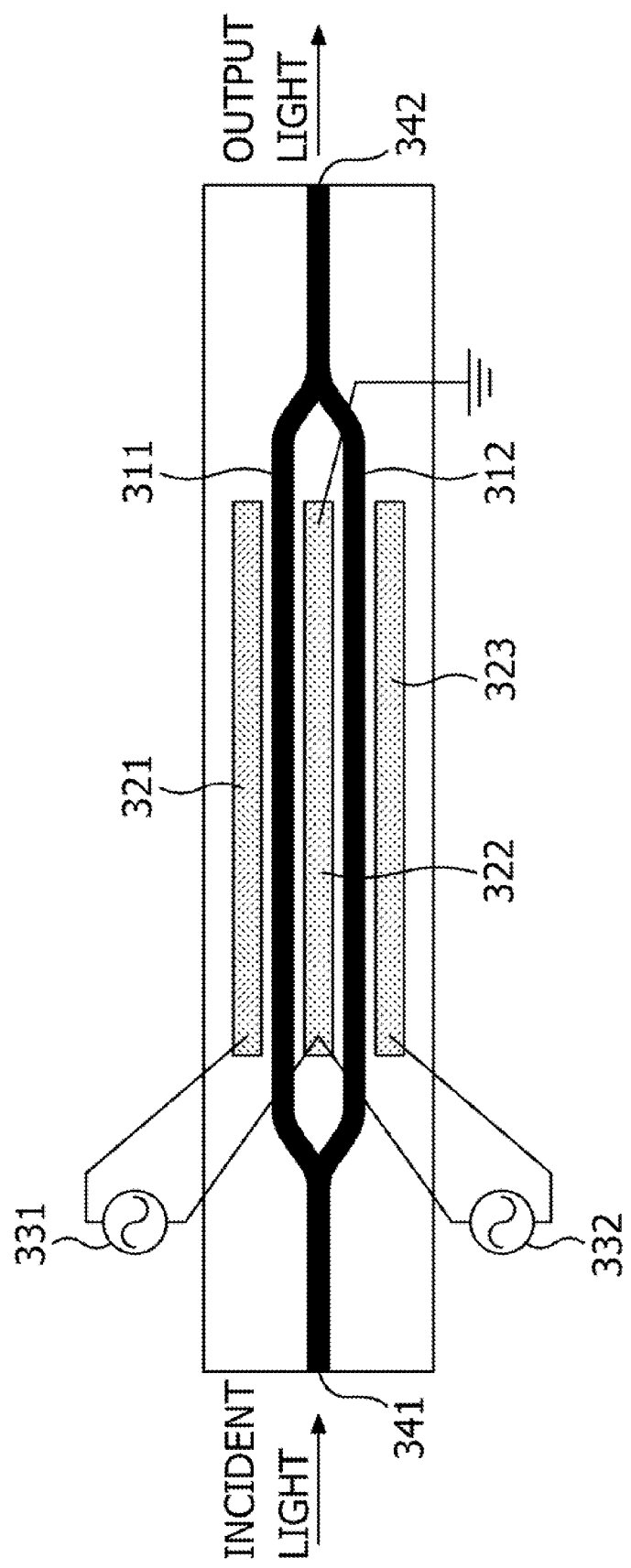
FIG. 1 illustrates an exemplary Mach-Zehnder optical modulator.

FIG. 1 illustrates an exemplary Mach-Zehnder optical modulator. The Mach-Zehnder optical modulator includes a first arm 311 and a second arm 312 formed on a semiconductor substrate to serve as an optical waveguide. Electrodes 321, 322, and 323, to which an electric field is applied to vary a refractive index, are provided along the first arm 311 and the second arm 312.

A first electrical signal source 331 is provided between the electrode 321 and the electrode 322, and a second electrical signal source 332 is provided between the electrode 322 and the electrode 323. The electrode 322 may be grounded. Incident light, which is continuous light incident from an incidence portion 341, is branched and propagated into the first arm 311 and the second arm 312, modulated, multiplexed, and output from an outputting portion 342 as output light, which is modulated light.

The light intensity of the output light output from the outputting portion 342 is varied in accordance with the difference in phase between light propagated through the first arm 311 and light propagated through the second arm 312. When the arm length of the first arm 311 and the second arm 312 is defined as L, the wavelength of the propagated light is defined as $\lambda$, and the refractive index of the first arm 311 and the second arm 312 is defined as n, the phase of light propagated through the first arm 311 and the second arm 312 is indicated by the following formula (1).

$$2nL/\lambda \qquad (1)$$

A voltage is applied to the electrodes 321, 322, and 323 to vary the refractive index n of the optical waveguide in the first arm 311 and the second arm 312. Therefore, a phase difference occurs between light propagated through the first arm 311 and light propagated through the second arm 312, thereby modulating the lights.

The arm length L is determined by varying the phase of light propagated through the first arm 311 or the second arm 312 by $\lambda$ to modulate the output light.

In an optical modulator that resonates light, a resonator having an arm with a length L may be formed with high accuracy.

In a Mach-Zehnder modulator in which a Fabry-Perot (FP) resonator including diffraction gratings, for example mirrors, is loaded on an arm, propagated light may reciprocate between the mirrors, thereby increasing the optical path length. Light may travel slowly over the resonator length L of the FP resonator (slow light effect). Variations in phase of propagated light transmitted through the resonator for certain variations in refraction of a certain waveguide may be increased for the amount of resonance. Therefore, the arm length may be shortened. In order to reduce a reflection of the input light incident to the modulator by the resonator, the input light, for example the operating wavelength of the modulator, is matched with the resonance wavelength of the resonator. When the operating wavelength is λ, the resonator length is L, and the refractive index of the waveguide is n, the conditions are indicated by the following formula (2), where m is an integer that is not negative:

$$L = \frac{(2m+1)\lambda}{4n} \quad (2)$$

Figure 2:
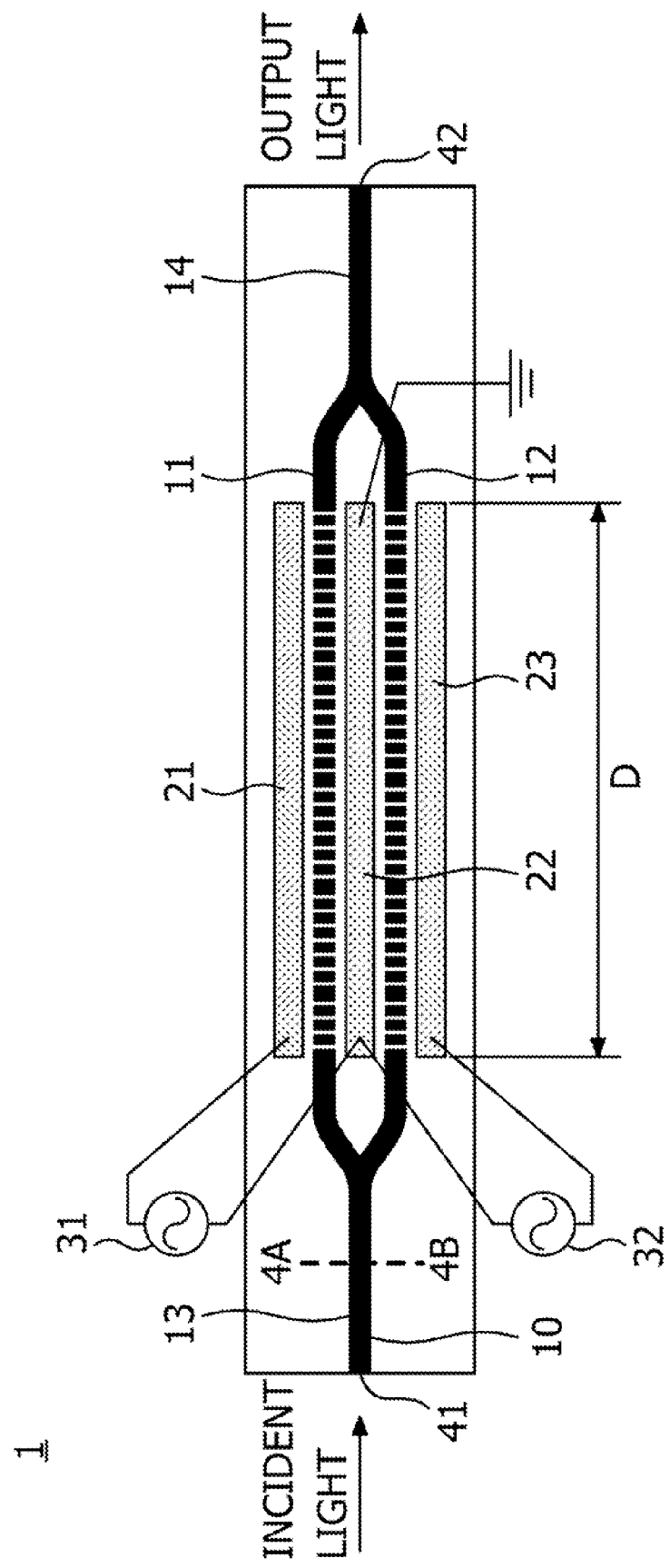
FIG. 2 illustrates an exemplary optical modulation apparatus.

FIG. 2 illustrates an exemplary optical modulation apparatus. The optical modulation apparatus illustrated in FIG. 2 includes an optical waveguide 10 having a first arm 11 and a second arm 12 formed on a semiconductor substrate. The first arm 11 and the second arm 12 are coupled to a straight optical waveguide region 13 provided on a light incident side, and are coupled to a straight optical waveguide region 14 provided on a light output side. Electrodes 21, 22, and 23, to which an electric field is applied, are provided along the first arm 11 and the second arm 12 on both sides of the first arm 11 and the second arm 12. A voltage is applied between the electrode 21 and the electrode 22, which are provided on both sides of the first arm 11, to vary the refractive index of the first arm 11. A voltage is applied between the electrode 22 and the electrode 23, which are provided on both sides of the second arm 12, to vary the refractive index of the second arm 12.

A first electrical signal source 31 is provided between the electrode 21 and the electrode 22. A second electrical signal source 32 is provided between the electrode 22 and the electrode 23. The electrode 22 may be grounded. Incident light, which is continuous light incident from an incidence portion 41, is propagated to the straight optical waveguide region 13 in the optical waveguide 10, thereafter branched and propagated into the first arm 11 and the second arm 12, and modulated by controlling the first electrical signal source 31 and the second electrical signal source 32. The modulated incident light is multiplexed again, propagated through the straight optical waveguide region 14 in the optical waveguide 10, and output from an outputting portion 42 as output light, which is modulated light.

A free-carrier plasma effect may be utilized. The concentration of electrons or holes in the first arm 11 or the second arm 12 is adjusted, in the free-carrier plasma effect, by a high-frequency voltage being applied for modulation by the first electrical signal source 31 and the second electrical signal source 32 which apply. Modulating the carrier concentration of electrons or holes varies the refractive index of the first arm 11 or the second arm 12, which modulates the phase of propagated light. The first electrical signal source 31 and the second electrical signal source 32 may be controlled in a push-pull manner.

Figure 3:
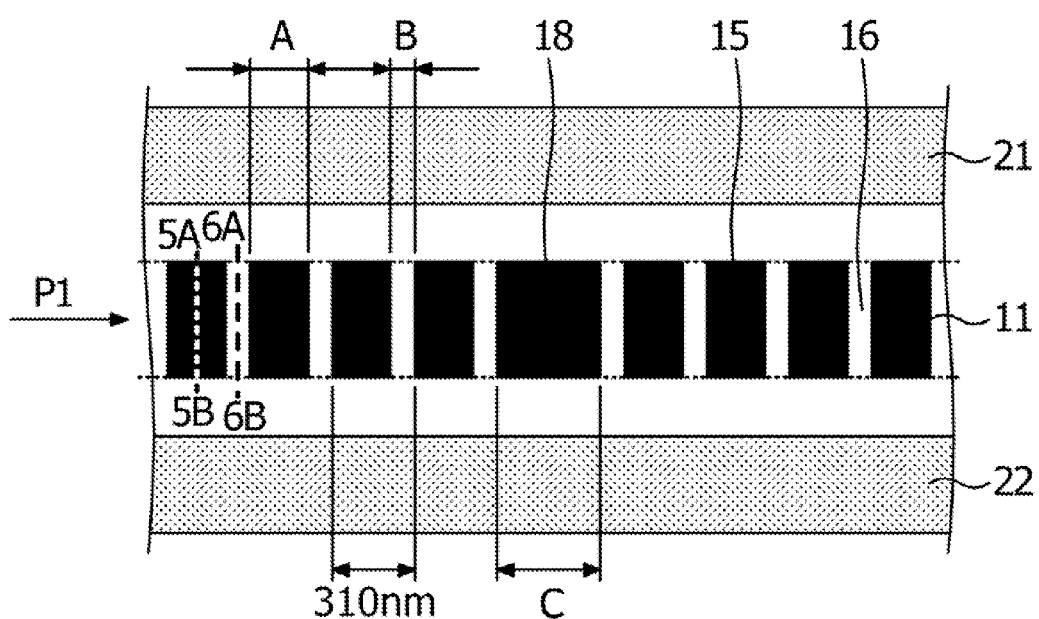
FIG. 3 illustrates an exemplary arm.

FIG. 3 illustrates an exemplary arm. The arm illustrated in FIG. 3 may be an enlarged version of the first arm 11 illustrated in FIG. 2. The optical waveguide in the first arm 11 includes a diffraction grating region where a high refractive index region 15 and a low refractive index region 16 are provided alternately, and a λ/4 phase shift region 18. The λ/4 phase shift region 18 may correspond to a resonator for light. At the resonance wavelength, propagation of light may be slowed to increase the efficiency of modulating the phase of light. The configuration of the second arm 12 may be substantially the same as or similar to the configuration of the first arm 11.

Figure 4:
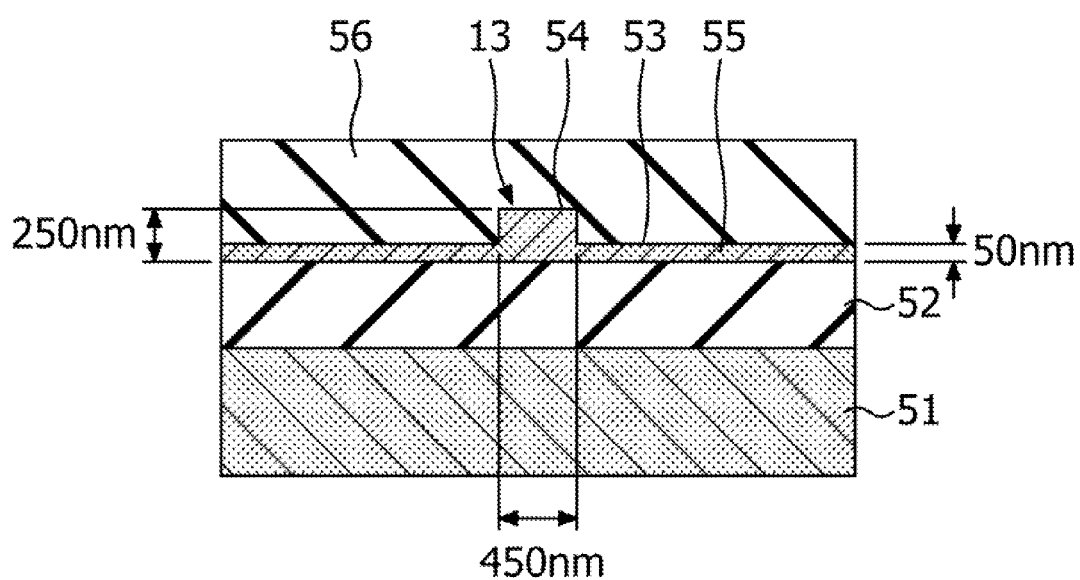
FIG. 4 illustrates an exemplary cross section of an optical modulation apparatus.

FIG. 4 illustrates an exemplary cross section of an optical modulation apparatus. The cross section illustrated in FIG. 4 may be a cross section taken along the broken line 4A-4B illustrated in FIG. 2. The cross section taken along the broken line 4A-4B may be a cross section of the straight optical waveguide region 13 in the optical waveguide 10. The cross-sectional structure of the straight optical waveguide region 14 in the optical waveguide 10 may be substantially the same as or similar to the cross-sectional structure of the straight optical waveguide region 13. As illustrated in FIG. 4, an embedded oxide film 52 including $SiO_2$ (silicon oxide) is formed on a silicon substrate 51, and a silicon layer 53 is formed on the oxide film 52. The silicon layer 53 includes a projecting portion 54 with a large film thickness and a flat portion 55 with a small film thickness, and the straight optical waveguide region 13 in the optical waveguide 10 includes the projecting portion 54. An oxide film 56 is formed on the silicon layer 53. The film thickness of the flat portion 55 of the silicon layer 53 may be 50 nanometers (nm), and the film thickness and the width of the projecting portion 54 may be 250 nm and 450 nm, respectively.

Figure 5:
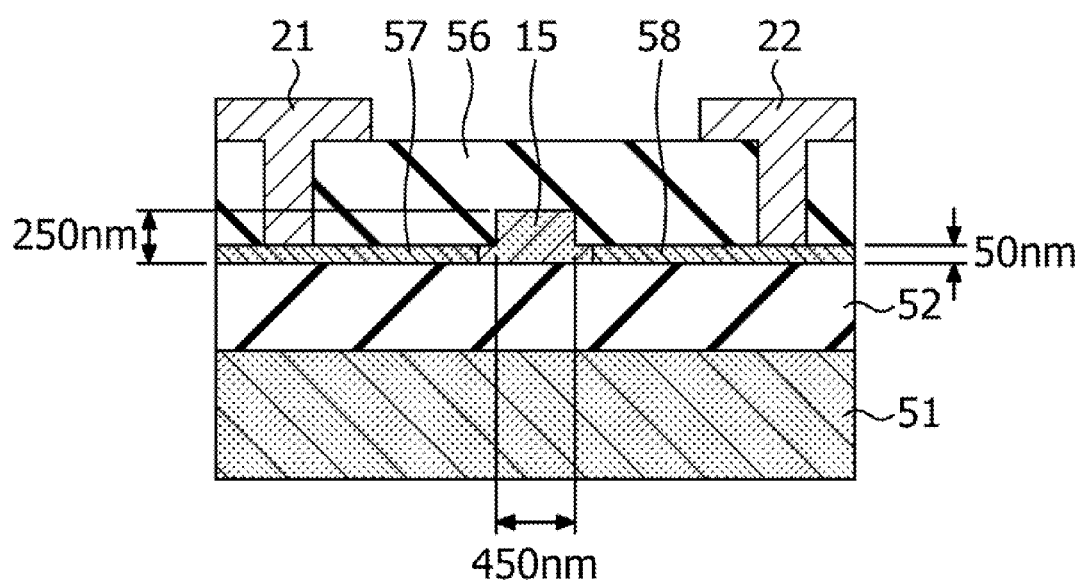
FIG. 5 illustrates an exemplary cross section of an optical modulation apparatus.

FIG. 5 illustrates an exemplary cross section of an optical modulation apparatus. The cross section illustrated in FIG. 5 may be a cross section taken along the broken line 5A-5B illustrated in FIG. 3. As illustrated in FIG. 5, in the high refractive index region 15, the embedded oxide film 52 including $SiO_2$ is formed on the silicon substrate 51, and the high refractive index region 15 including silicon (Si) is formed on the oxide film 52. An n-type region 57 and a p-type region 58 are formed on both sides of the high refractive index region 15 in the optical waveguide 10, and the oxide film 56 is formed on the high refractive index region 15.

Figure 6:
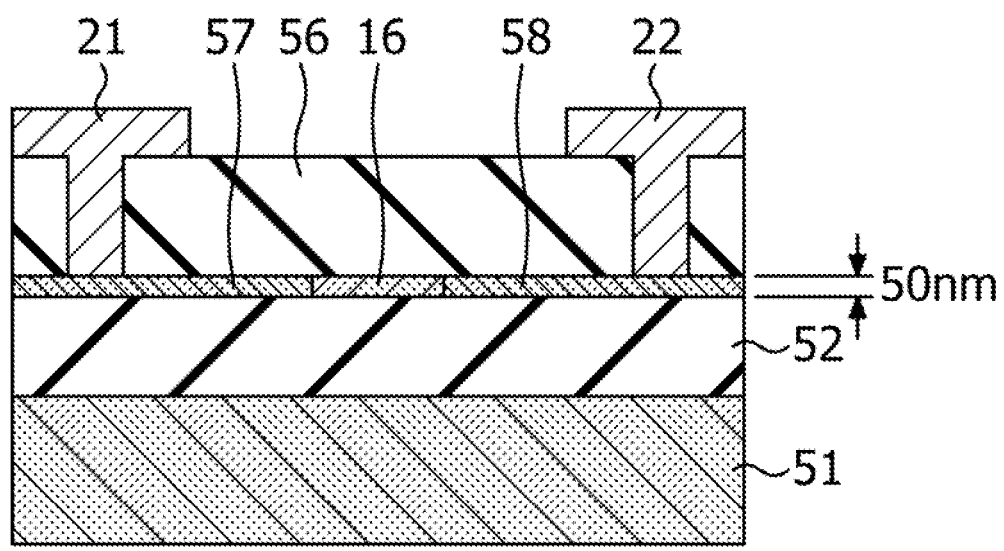
FIG. 6 illustrates an exemplary cross section of an optical modulation apparatus.

FIG. 6 illustrates an exemplary cross section of an optical modulation apparatus. The cross section illustrated in FIG. 6 may be a cross section taken along the broken line 6A-6B illustrated in FIG. 3. As illustrated in FIG. 6, in the low refractive index region 16, the embedded oxide film 52 including silicon dioxide ($SiO_2$) is formed on the silicon substrate 51, and the low refractive index region 16 including silicon is formed on the oxide film 52. The n-type region 57 and the p-type region 58 are formed on both sides of the low refractive index region 16 in the optical waveguide 10, and the oxide film 56 is formed on the low refractive index region 16.

As illustrated in FIGS. 5 and 6, the projecting portion 54 is provided in the high refractive index region 15 so that the waveguide is thicker in the high refractive index region 15 than in the low refractive index region 16.

In the high refractive index region 15 and the low refractive index region 16, an opening is formed in the oxide film 56 on the n-type region 57 so that the electrode 21 including a metal material is coupled to the n-type region 57. Also, an opening is formed in the oxide film 56 on the p-type region 58 so that the electrode 22 including a metal material is coupled to the p-type region 58.

The film thickness of the oxide film 52 may be about 2 μm, and the film thickness of the n-type region 57 and the p-type region 58 may be about 50 nm. The thickness and the width of the high refractive index region 15 may be about 250 nm and about 450 nm, respectively, and the thickness of the low refractive index region 16 may be about 50 nm. The thickness of the low refractive index region 16 may be substantially the same as the thickness of the n-type region 57 and the p-type region 58. The cross-sectional structure of the λ/4 phase shift region 18 may be substantially the same as or similar to the cross-sectional structure of the high refractive index region 15.

In the optical modulation apparatus, the λ/4 phase shift region 18 is provided between the diffraction grating region where the high refractive index region 15 and the low refractive index region 16 are formed alternately. The optical modulation apparatus may support light having a wavelength of 1.55 μm. In the traveling direction of light indicated by the arrow P1 in FIG. 3, the length A of the high refractive index region 15 may be about 248 nm, and the length B of the low refractive index region 16 may be about 62 nm. The high refractive index region 15 and the low refractive index region 16 may be formed at a cycle of about 310 nm. The length C of the λ/4 phase shift region 18 may be about 400 nm. The length C of the λ/4 phase shift region 18 is calculated as the sum of the length A of the high refractive index region 15 and one fourth of a length of about 620 nm of the wavelength based on the respective refractive indexes of the high refractive index region 15 and the low refractive index region 16 which correspond to light having a wavelength of 1.55 μm. The lengths A, B, and C may be different depending on the wavelength used.

The structure of the first arm 11 may be the substantially the same as or similar to the structure of the second arm 12. As indicated in Table 1, the diffraction grating regions and the λ/4 phase shift regions 18 may be formed alternately with the number of the λ/4 phase shift regions 18 being 5, for example.

TABLE 1

| Section | Length (μm) | Number of cycles |
|---|---|---|
| First diffraction grating region | 4.96 | 16 |
| λ/4 phase shift region | | |
| Second diffraction grating region | 9.92 | 32 |
| λ/4 phase shift region | | |
| Third diffraction grating region | 9.92 | 32 |
| λ/4 phase shift region | | |
| Fourth diffraction grating region | 9.92 | 32 |
| λ/4 phase shift region | | |
| Fifth diffraction grating region | 9.92 | 32 |
| λ/4 phase shift region | | |
| Sixth diffraction grating region | 4.96 | 16 |
| Overall length | 49.6 | |

In the first arm 11 and the second arm 12, from the incidence portion side 41, a first diffraction grating region, in which the high refractive index region 15 and the low refractive index region 16 are formed in 16 cycles, is formed. The λ/4 phase shift regions 18 and a second diffraction grating region to a fifth diffraction grating region, in each of which the high refractive index region 15 and the low refractive index region 16 are formed in 32 cycles, are formed alternately. A sixth diffraction grating region, in which the high refractive index region 15 and the low refractive index region 16 are formed in 16 cycles, is formed. In the first diffraction grating region and the sixth diffraction grating region, the high refractive index region 15 and the low refractive index region 16 may be provided in 16 cycles, and the length of each of the first diffraction grating region and the sixth diffraction grating region in the traveling direction of light may be about 4.96 μm. In the second diffraction grating region to the fifth diffraction grating region, the high refractive index region 15 and the low refractive index region 16 may be provided in 32 cycles, and the length of each of the second diffraction grating region to the fifth diffraction grating region in the traveling direction of light may be about 9.92 μm. The total length of the first to sixth diffraction grating regions and the λ/4 phase shift regions 18 may be about 49.6 μm. The length D of the electrodes 21, 22, and 23 illustrated in FIG. 2 may be about 49.6 μm.

Figure 7:
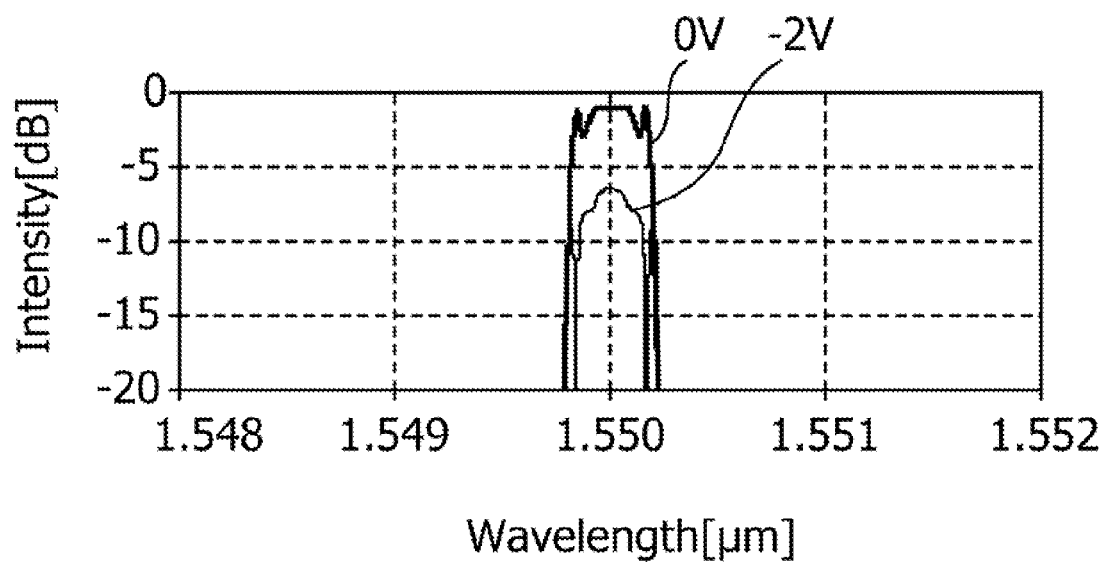
FIG. 7 illustrates an exemplary output light spectrum.

FIG. 7 illustrates an exemplary output light spectrum. FIG. 7 illustrates an output light spectrum obtained when the first electrical signal source 31 and the second electrical signal source 32 apply voltages of 0 V and −2 V to the first arm 11 and the second arm 12, respectively, in the optical modulator structured as indicated in Table 1, and an output light spectrum obtained when the first electrical signal source 31 and the second electrical signal source 32 apply voltages of −2 V and 0 V to the first arm 11 and the second arm 12, respectively. When a voltage of −2 V is applied by the first electrical signal source 31 and the second electrical signal source 32, the refractive index is varied by $4 \times 10^{-5}$ in the high refractive index region 15 and the λ/4 phase shift region 18 compared to a case where a voltage of 0 V is applied. As illustrated in FIG. 7, the light intensity of the output light at 1.55 μm may be reduced by about 5 dB by applying a voltage of −2 V. A contrast (extinction ratio) of about 5 dB may be obtained by applying a voltage between 0 V and −2 V.

When a material that is substantially the same as a material contained in the optical waveguide 10 is used in the optical modulation apparatus illustrated in FIG. 1, the length of the optical waveguide 10, for example the length of the first arm 311 and the second arm 312, may be about 3.5 mm. The length of the first arm 11 and the second arm 12 in the optical modulation apparatus illustrated in FIG. 2 may be about 49.6 μm.

The operating wavelength of the optical modulation apparatus illustrated in FIG. 2 is determined by the average cycle of the diffraction gratings formed in the diffraction grating regions, and therefore may be controlled with high accuracy.

Phase shift regions with any phase shift amount in the range of 0 to λ/2 may be formed in place of the λ/4 phase shift regions 18. When the phase shift amount is λ/4, the resonance wavelength substantially coincides with the Bragg wavelength in the diffraction grating regions, and the light spectrum is symmetric with respect to the resonance wavelength. Therefore, the λ/4 phase shift regions may be formed as phase shift regions. In the first arm 11 and the second arm 12, different diffraction grating regions and the λ/4 phase shift regions 18 may be formed.

In the optical modulation apparatus illustrated in FIG. 2, the number of cycles of diffraction gratings in the first diffraction grating region and the sixth diffraction grating region, which are formed on the incidence portion 41 side and the outputting portion 42 side of the optical waveguide 10, may be substantially half the number of cycles of diffraction gratings in the second diffraction grating region to the fifth diffraction grating region. When the number of cycles of diffraction gratings in the outer diffraction grating regions is substantially half the number of cycles of diffraction gratings in the inner diffraction grating regions, the light spectrum may be comparatively flat in a band around the resonance wavelength, and a substantially uniform extinction ratio may be obtained in a wide wavelength band.

Figure 8:
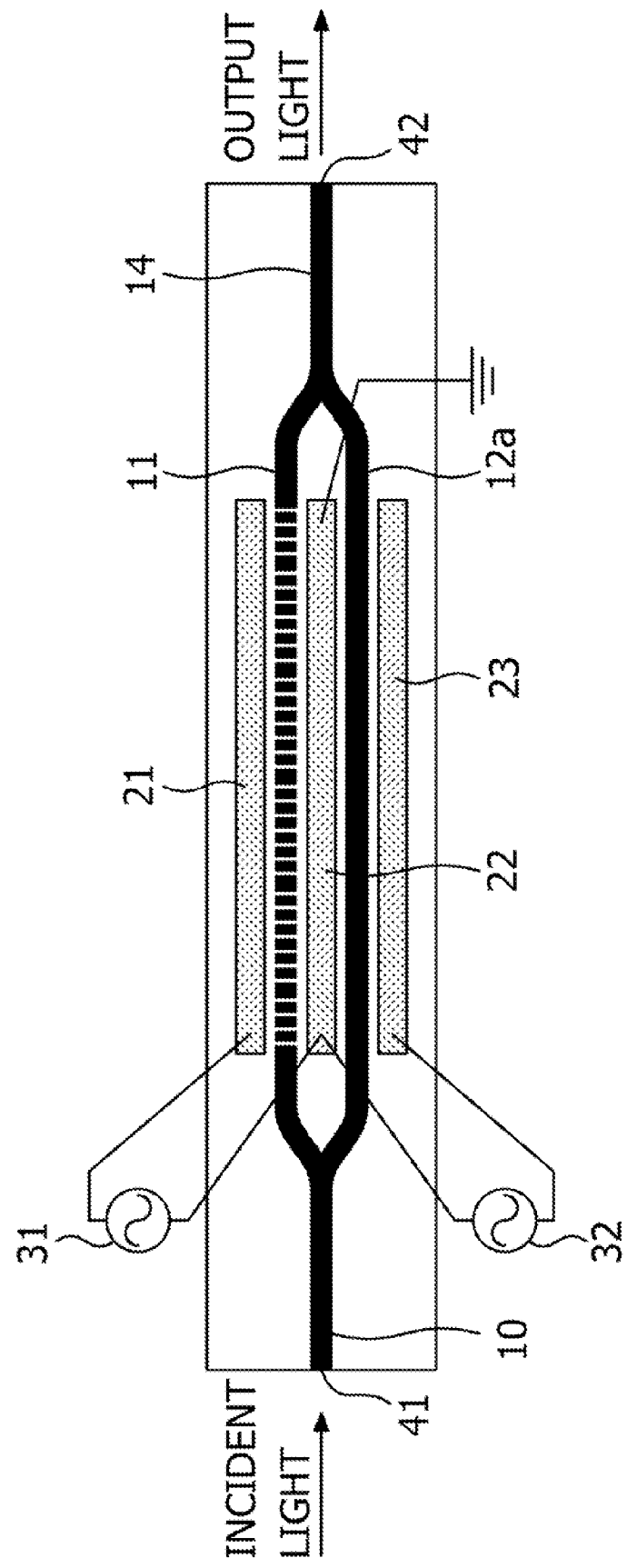
FIG. 8 illustrates an exemplary optical modulation apparatus.

The diffraction grating regions and the λ/4 phase shift regions 18 may be formed in one of the first arm and the second arm. For example, as illustrated in FIG. 8, the diffraction grating regions and the λ/4 phase shift regions 18 may be formed in only the first arm 11, and no diffraction grating regions or no λ/4 phase shift regions 18 may be formed in the second arm 12a. This may reduce the size of the optical modulation apparatus, which may increase the modulation efficiency of the optical modulation apparatus.

When the diffraction grating regions and the λ/4 phase shift regions 18 are formed in the first arm 11 and the second arm 12, the respective delay times for light propagated through the first arm 11 and light propagated through the second arm 12 may be substantially the same as each other. The phase difference with no voltage application is set to be substantially constant irrespective of the operating wavelength. When the operating wavelength of the optical modulation apparatus is constant and the phase difference with no voltage application is substantially constant, the diffraction grating regions and the λ/4 phase shift regions 18 may be formed in only one of the first arm 11 and the second arm 12.

Figure 9:
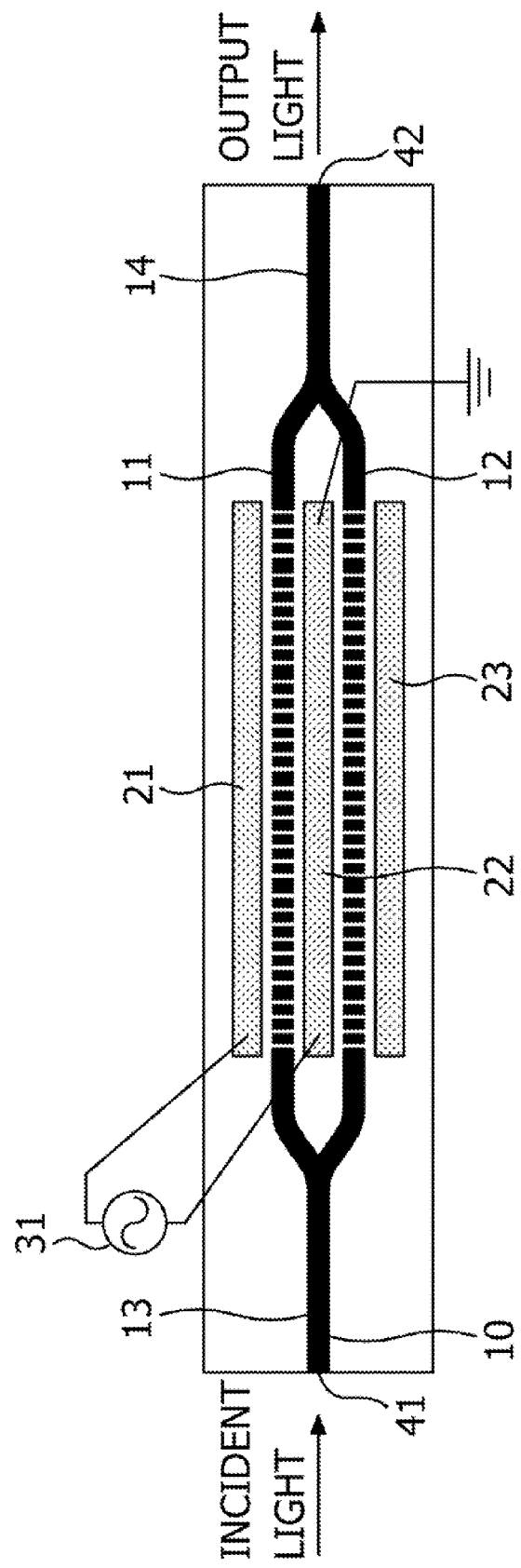
FIG. 9 illustrates an exemplary optical modulation apparatus.

Only one of the first electrical signal source and the second electrical signal source may be provided. For example, as illustrated in FIG. 9, only the first electrical signal source 31 may be provided, and no second electrical signal source may be provided. The amplitude of the voltage applied by the first electrical signal source 31 may be twice compared to a case where the first electrical signal source and the second electrical signal source are driven in a push-pull manner. When only one electrical signal source is provided, control may be simplified and the production cost may be reduced. When only one electrical signal source is provided, the diffraction grating regions and the λ/4 phase shift regions 18 may be formed in the first arm 11 and the second arm 12.

At least one or more λ/4 phase shift regions 18 may be formed in the first arm 11 or the second arm 12. The number of λ/4 phase shift regions 18 formed may be determined in accordance with the specifications required for the optical modulation apparatus.

In the optical modulation apparatus illustrated in FIG. 2, as indicated in Table 2, for example, the diffraction grating regions and the λ/4 phase shift regions 18 may be formed alternately with the number of the λ/4 phase shift regions 18 being 10.

TABLE 2

| Section | Length (μm) | Number of cycles |
|---|---|---|
| First diffraction grating region | 4.34 | 14 |
| λ/4 phase shift region | | |
| Second diffraction grating region | 8.68 | 28 |
| λ/4 phase shift region | | |
| Third diffraction grating region | 8.68 | 28 |
| λ/4 phase shift region | | |
| Fourth diffraction grating region | 8.68 | 28 |
| λ/4 phase shift region | | |
| Fifth diffraction grating region | 8.68 | 28 |
| λ/4 phase shift region | | |
| Sixth diffraction grating region | 8.68 | 28 |
| λ/4 phase shift region | | |
| Seventh diffraction grating region | 8.68 | 28 |
| λ/4 phase shift region | | |
| Eighth diffraction grating region | 8.68 | 28 |
| λ/4 phase shift region | | |
| Ninth diffraction grating region | 8.68 | 28 |
| λ/4 phase shift region | | |
| Tenth diffraction grating region | 8.68 | 28 |
| λ/4 phase shift region | | |
| Eleventh diffraction grating region | 4.34 | 14 |
| Overall length | 86.8 | |

In the first arm 11 and the second arm 12, from the incidence portion 41 side, a first diffraction grating region, in which the high refractive index region 15 and the low refractive index region 16 are formed in 14 cycles, is formed. The λ/4 phase shift regions 18 and a second diffraction grating region to a tenth diffraction grating region, in each of which the high refractive index region 15 and the low refractive index region 16 are formed in 28 cycles, are formed alternately. An eleventh diffraction grating region, in which the high refractive index region 15 and the low refractive index region 16 are formed in 14 cycles, is formed. In the first diffraction grating region and the eleventh diffraction grating region, the high refractive index region 15 and the low refractive index region 16 may be provided in 14 cycles, and the length of each of the first diffraction grating region and the eleventh diffraction grating region in the traveling direction of light may be about 4.34 μm. In the second diffraction grating region to the tenth diffraction grating region, the high refractive index region 15 and the low refractive index region 16 may be provided in 28 cycles, and the length of each of the second diffraction grating region to the tenth diffraction grating region in the traveling direction of light may be about 8.68 μm. The total length of the first to eleventh diffraction grating regions and the λ/4 phase shift regions 18 may be about 86.8 μm. The length D of the electrodes 21, 22, and 23 illustrated in FIG. 2 may be about 86.8 μm.

Figure 10:
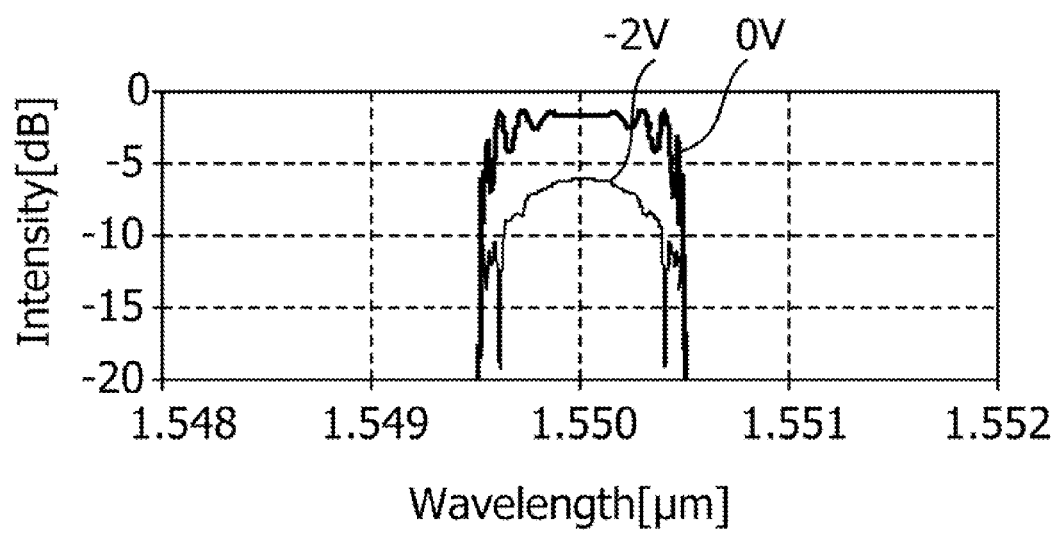
FIG. 10 illustrates an exemplary output light spectrum.

FIG. 10 illustrates an exemplary output light spectrum. The output light spectrum illustrated in FIG. 10 may be an output light spectrum obtained when the first electrical signal source 31 and the second electrical signal source 32 apply voltages of 0 V and −2 V, respectively, in the optical modulation apparatus including the first arm 11 and the second arm 12 having a structure indicated in Table 2. When a voltage of −2 V is applied by the first electrical signal source 31 and the second electrical signal source 32, the refractive index may be varied by $4 \times 10^{-5}$ in the high refractive index region 15 and the λ/4 phase shift region 18. The light intensity of the output light at 1.55 μm may be reduced by about 5 db by applying a voltage of −2 V. For example, a contrast about 5 dB, for example, an extinction ratio may be obtained by applying a voltage between 0 V and −2 V.

The optical modulation apparatus in which the diffraction grating regions and the λ/4 phase shift regions 18 are formed alternately with the number of the λ/4 phase shift regions 18 being 10 may be reduced in size, and may perform light modulation in a wider wavelength band.

Two λ/4 phase shift regions 18 may be provided in the first arm 11 and the second arm 12.

For example, in the optical modulation apparatus illustrated in FIG. 2, as indicated in Table 3, the diffraction grating regions and the λ/4 phase shift regions 18 may be formed alternately with the number of the λ/4 phase shift regions 18 being two.

TABLE 3

| Section | Length (μm) | Number of cycles |
|---|---|---|
| First diffraction grating region | 5.58 | 18 |
| λ/4 phase shift region | | |
| Second diffraction grating region | 11.16 | 36 |
| λ/4 phase shift region | | |
| Third diffraction grating region | 5.58 | 18 |
| Overall length | 22.32 | |

In the first arm 11 and the second arm 12, from the incidence portion 41 side, a first diffraction grating region, in which the high refractive index region 15 and the low refractive index region 16 are formed in 18 cycles, is formed. The λ/4 phase shift regions 18 and a second diffraction grating region, in each of which the high refractive index region 15 and the low refractive index region 16 are formed in 36 cycles, are formed alternately. A sixth diffraction grating region, in which the high refractive index region 15 and the low refractive index region 16 are formed in 18 cycles, is formed. In the first diffraction grating region and the third diffraction grating region, the high refractive index region 15 and the low refractive index region 16 may be provided in 18 cycles, and the length of each of the first diffraction grating region and the third diffraction grating region in the traveling direction of light may be about 5.58 μm. In the second diffraction grating region, the high refractive index region 15 and the low refractive index region 16 may be provided in 36 cycles, and the length of the second diffraction grating region in the traveling direction of light may be about 11.16 μm. The total length of the first to third diffraction grating regions and the λ/4 phase shift regions 18 may be about 22.32 μm. The length D of the electrodes 21, 22, and 23 illustrated in FIG. 2 may be about 22.32 μm.

Figure 11:
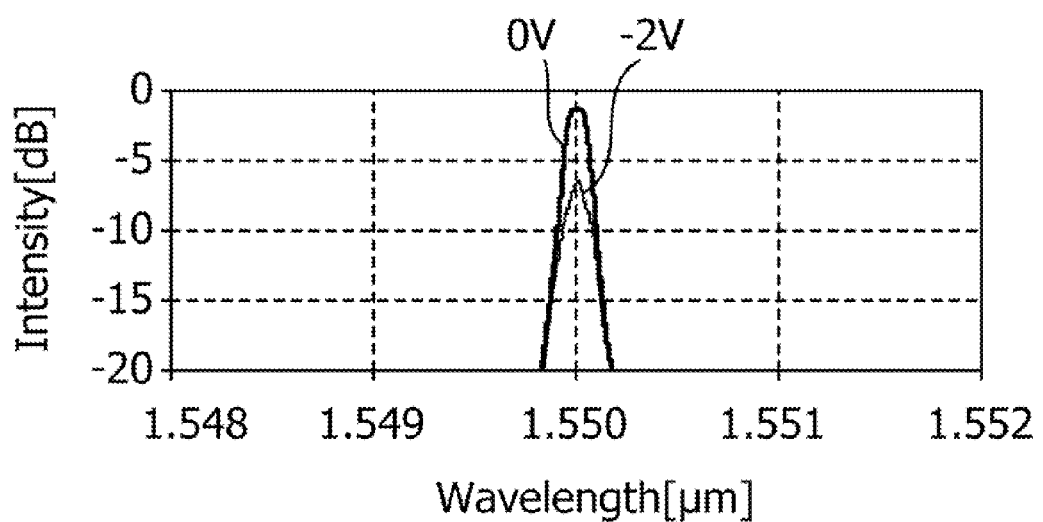
FIG. 11 illustrates an exemplary output light spectrum.

FIG. 11 illustrates an exemplary output light spectrum. The output light spectrum illustrated in FIG. 11 may be an output light spectrum obtained when the first electrical signal source 31 and the second electrical signal source 32 apply voltages of 0 V and −2 V, respectively, in the optical modulation apparatus including the first arm 11 and the second arm 12 having a structure indicated in Table 3. When a voltage of −2 V is applied by the first electrical signal source 31 and the second electrical signal source 32, the refractive index may be varied by $4 \times 10^{-5}$ in the high refractive index region 15 and the λ/4 phase shift region 18. The light intensity of the output light at a wavelength of 1.55 μm may be reduced by about 5 dB by applying a voltage of −2 V, like as the optical modulation apparatus illustrated in FIG. 2. A contrast (extinction ratio) of about 5 dB may be obtained by applying a voltage between 0 V and −2 V.

The wavelength band for modulation may be narrowed. The wavelength band for modulation may be narrow compared to the optical modulation apparatus illustrated in FIG. 2. Other elements may be substantially the same as or similar to the elements of the optical modulation apparatus illustrated in FIG. 2.

By selecting the number of the λ/4 phase shift regions provided in the first arm 11 and the second arm 12 of the optical modulation apparatus, desired characteristics of the optical modulation apparatus may be obtained.

For example, voltages applied by the first electrical signal source 31 and the second electrical signal source 32 illustrated in FIG. 2 may be in the forward bias direction.

For example, in the optical modulation apparatus illustrated in FIG. 2, as indicated in Table 4, the diffraction grating regions and the λ/4 phase shift region 18 may be formed alternately with the number of the λ/4 phase shift regions 18 being five.

TABLE 4

| Section | Length (μm) | Number of cycles |
|---|---|---|
| First diffraction grating region | 2.17 | 7 |
| λ/4 phase shift region | | |
| Second diffraction grating region | 4.34 | 14 |
| λ/4 phase shift region | | |
| Third diffraction grating region | 4.34 | 14 |
| λ/4 phase shift region | | |
| Fourth diffraction grating region | 4.34 | 14 |
| λ/4 phase shift region | | |
| Fifth diffraction grating region | 4.34 | 14 |
| λ/4 phase shift region | | |
| Sixth diffraction grating region | 2.17 | 7 |
| Overall length | 21.7 | |

The first arm 11 and the second arm 12 include, from the incidence portion 41 side, a first diffraction grating region, in which the high refractive index region 15 and the low refractive index region 16 are formed in 7 cycles. The λ/4 phase shift regions 18 and a second diffraction grating region to a fifth diffraction grating region, in each of which the high refractive index region 15 and the low refractive index region 16 are formed in 14 cycles, are formed alternately. A sixth diffraction grating region, in which the high refractive index region 15 and the low refractive index region 16 are formed in 7 cycles, is formed. In the first diffraction grating region and the sixth diffraction grating region, the high refractive index region 15 and the low refractive index region 16 may be provided in 7 cycles, and the length of each of the first diffraction grating region and the sixth diffraction grating region in the traveling direction of light may be about 2.17 μm. In the second diffraction grating region to the fifth diffraction grating region, the high refractive index region 15 and the low refractive index region 16 may be provided in 14 cycles, and the length of each of the second diffraction grating region to the fifth diffraction grating region in the traveling direction of light may be about 4.34 μm. The total length of the first to sixth diffraction grating regions and the λ/4 phase shift regions 18 may be about 21.7 μm. The length D of the electrodes 21, 22, and 23 illustrated in FIG. 2 may be about 21.7 μm.

Figure 12:
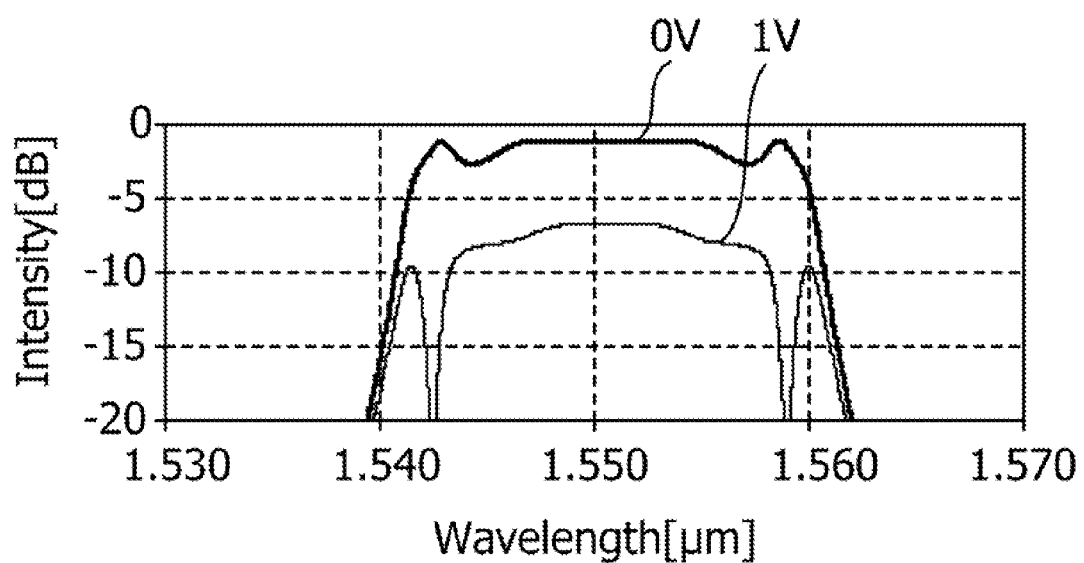
FIG. 12 illustrates an exemplary output light spectrum.

FIG. 12 illustrates an exemplary output light spectrum. The output light spectrum illustrated in FIG. 12 may be an output light spectrum obtained when the first electrical signal source 31 and the second electrical signal source 32 apply voltages of 0 V and 1 V, respectively, in the optical modulation apparatus including the first arm 11 and the second arm 12 having a structure indicated in Table 4. When a voltage of 1 V is applied by the first electrical signal source 31 and the second electrical signal source 32, the refractive index may be varied by $2 \times 10^{-3}$ in the high refractive index region 15 and the λ/4 phase shift region 18. As illustrated in FIG. 12, the light intensity of the output light at 1.55 μm may be reduced by about 5 dB by applying a voltage of 1 V may reduce, like as the optical modulation apparatus illustrated in FIG. 2. A contrast (extinction ratio) of about 5 dB may be obtained by applying a voltage between 0 V and 1 V.

The modulation rate may be reduced compared to the optical modulation apparatus illustrated in FIG. 2 by applying voltages in the forward bias direction. The size of the optical modulation apparatus may be reduced compared to the optical modulation apparatus illustrated in FIG. 2. The bandwidth of the wavelength of light to be modulated is widened, and the voltage to be applied for modulation is reduced, thereby the optical modulation apparatus being driven with reduced power. Such an optical modulation apparatus may be applied to an optical switch or the like.

Other components may be substantially the same as or similar to the components of the optical modulation apparatus illustrated in FIG. 2.

Figure 13:
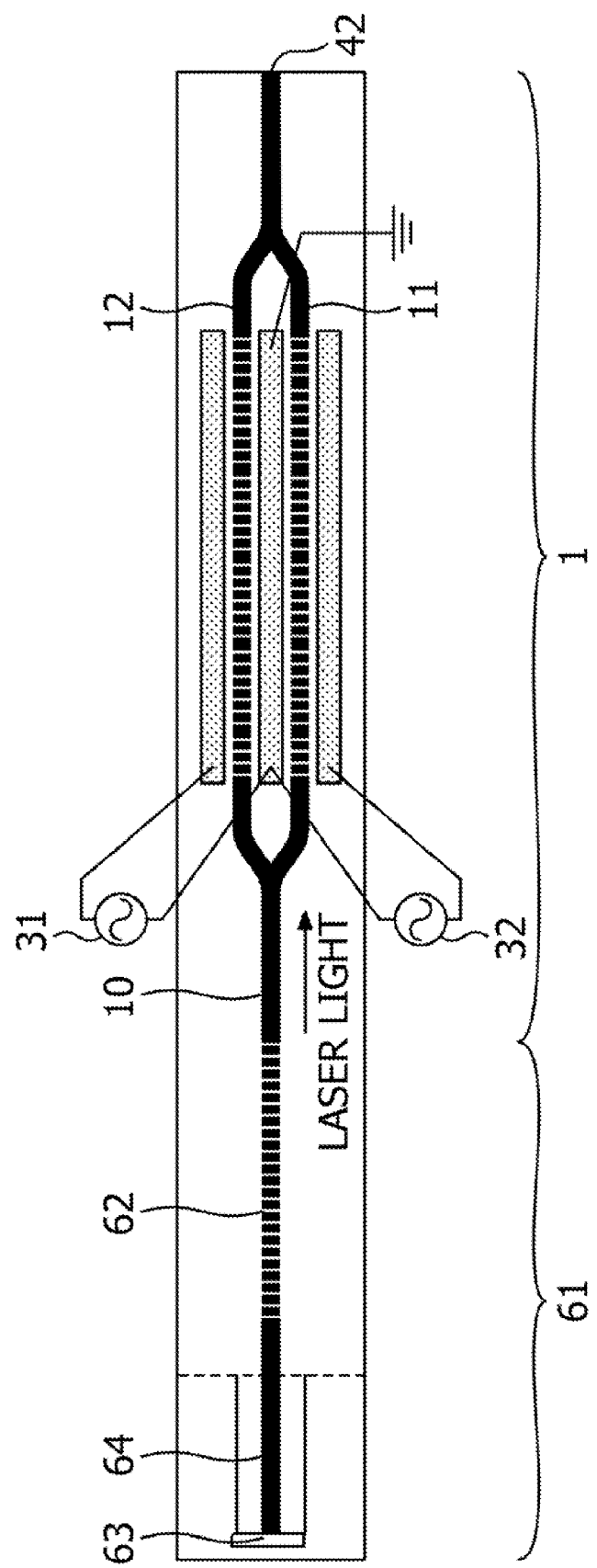
FIG. 13 illustrates an exemplary light integration apparatus.

FIG. 13 illustrates an exemplary optical modulation/integration apparatus. The optical modulation/integration apparatus illustrated in FIG. 13 may include a DBR laser 61 coupled to the incidence portion of the optical waveguide 10 of the optical modulation apparatus 1 illustrated in FIG. 2, for example. The DBR laser 61 includes a diffraction grating mirror 62 serving as a wavelength selection mirror.

Light oscillated by the DBR laser 61 is propagated through the optical waveguide 10, modulated by the first electrical signal source 31 and the second electrical signal source 32 in the optical modulation apparatus 1, and output as output light from the outputting portion 42. The DBR laser 61 includes the diffraction grating mirror 62 and a high refractive index mirror including a dielectric multilayer film and so forth. Light is resonated in an optical waveguide 64 between the diffraction grating mirror 62 and the high refractive index mirror 63. The optical waveguide 64 interposed between the high refractive index mirror 63 and the diffraction grating mirror 62 may include a material, which is different from a material included in the optical waveguide 10 in the optical modulation apparatus 1 and has an optical gain.

The diffraction grating mirror 62 of the DBR laser 61 may be formed in a process that is substantially the same as or similar to a process in which the high refractive index region 15 and the low refractive index region 16 are formed in the first arm 11 and the second arm 12 in the optical modulation apparatus 1. An optical modulation/integration apparatus including a semiconductor laser and an optical modulation apparatus may be manufactured at a low cost. The diffraction grating mirror 62 and the high refractive index region 15 and the low refractive index region 16 are generated substantially at the same time as each other. Therefore, when variations occur in shape of the high refractive index region 15 and the low refractive index region 16 or the like due to variations in process conditions or the like, similar variations may also occur in shape of the diffraction grating mirror 62. The amount of variations in operating wavelength of the DBR laser 61 due to variations in shape may be substantially the same as the amount of variations in operating wavelength of the optical modulation apparatus 1 due to variations in shape. When the process conditions vary, the operating wavelength of the DBR semiconductor laser 61 and the operating wavelength of the optical modulation apparatus 1 may coincide with each other.

Figure 14:
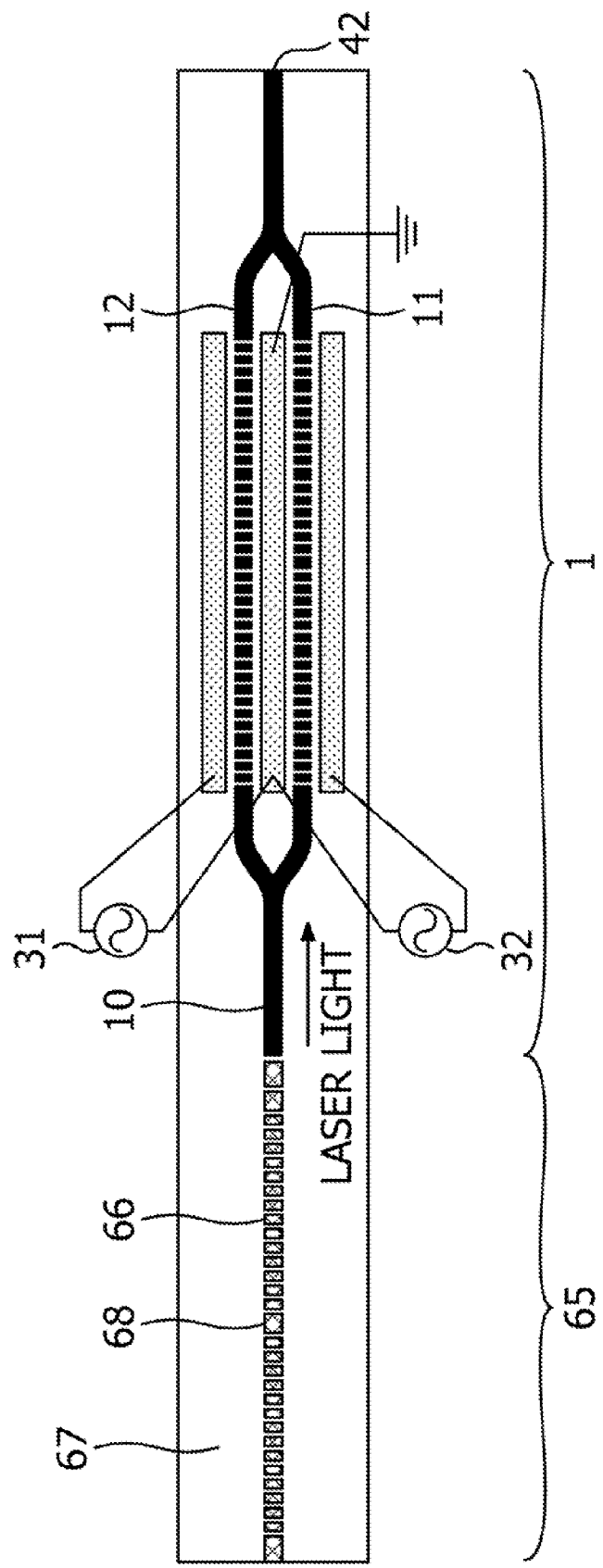
FIG. 14 illustrates an exemplary light integration apparatus.

FIG. 14 illustrates an exemplary optical modulation/integration apparatus. The optical modulation/integration apparatus illustrated in FIG. 14 may include a λ/4 phase shift DFB laser 65 serving as a semiconductor laser coupled to the incidence portion of the optical waveguide 10 of the optical modulation apparatus 1 illustrated in FIG. 2. In the λ/4 phase shift DFB laser 65, diffraction grating mirrors 66 and 67 serving as wavelength selection reflective mirrors are provided, and a λ/4 phase shift region 68 is formed between the diffraction grating mirror 66 and the diffraction grating mirror 67. Light oscillated by the λ/4 phase shift DFB laser 65 is propagated through the optical waveguide 10, modulated by the first electrical signal source 31 and the second electrical signal source 32 of the optical modulation apparatus 1, and output as output light from the outputting portion 42.

As opposed to a DBR (Distributed Bragg Reflector) laser, the DBR laser includes little low-frequency noise due to mode hopping, and may be easy to drive. A region of the optical waveguide that is formed in the λ/4 phase shift DFB laser 65 may include a material, which is different from a material contained in the optical waveguide 10 of the optical modulation apparatus 1 and has an optical gain.

The optical modulation/integration apparatuses illustrated in FIGS. 13 and 14 may include the optical modulation apparatuses indicated by Table 2 to Table 4.

The semiconductor laser included in the optical modulation/integration apparatus may be formed on the same substrate, and may be a Fabry-Perot semiconductor laser or the like. The wavelength selection mirror may be a ring resonator type.

Figure 15:
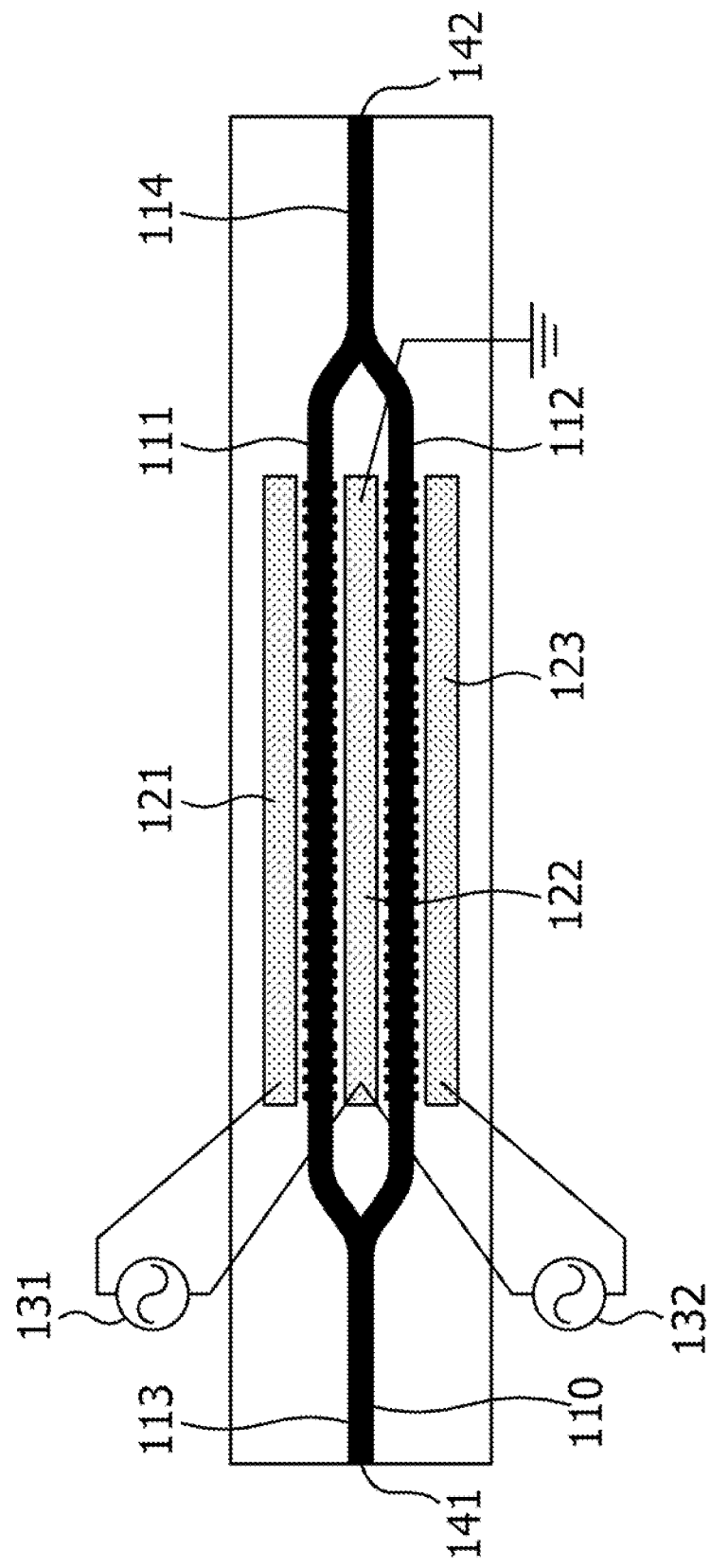
FIG. 15 illustrates an exemplary optical modulation apparatus.

FIG. 15 illustrates an exemplary optical modulation apparatus. In the optical modulation apparatus illustrated in FIG. 15, an optical waveguide 110 including a first arm 111 and a second arm 112 is formed on a semiconductor substrate. The first arm 111 and the second arm 112 are coupled to a straight optical waveguide region 113 provided on a light incident side, and are coupled to a straight optical waveguide region 114 provided on a light output side. Electrodes 121, 122, and 123, to which an electric field is applied to vary the refractive index, are provided along the first arm 111 and the second arm 112 on both sides of the first arm 111 and the second arm 112. A voltage is applied between the electrode 121 and the electrode 122, which are provided on both sides of the first arm 111, to vary the refractive index of the first arm 111. A voltage is applied between the electrode 122 and the electrode 123, which are provided on both sides of the second arm 112, to vary the refractive index of the second arm 112.

A first electrical signal source 131 is provided between the electrode 121 and the electrode 122, and a second electrical signal source 132 is provided between the electrode 122 and the electrode 123. The electrode 122 is grounded. Incident light, which is continuous light incident from an incidence portion 141, is propagated to the straight optical waveguide region 113 in the optical waveguide 110, thereafter branched and propagated into the first arm 111 and the second arm 112, and modulated by the first electrical signal source 131 and the second electrical signal source 132. After that, the light is multiplexed again, propagated through the straight optical waveguide region 114 in the optical waveguide 110, and output from an outputting portion 142 as output light, which is modulated light.

The first electrical signal source 131 and the second electrical signal source 132 apply a high-frequency voltage for modulation so that the concentration of electrons or holes in the first arm 111 or the second arm 112 is adjusted. A free-carrier plasma effect may be utilized. When the carrier concentration of electrons or holes is modulated, the refractive index of the first arm 111 or the second arm 112 is varied to modulate light. The first electrical signal source 131 and the second electrical signal source 132 may be driven in a push-pull manner.

Figure 16:
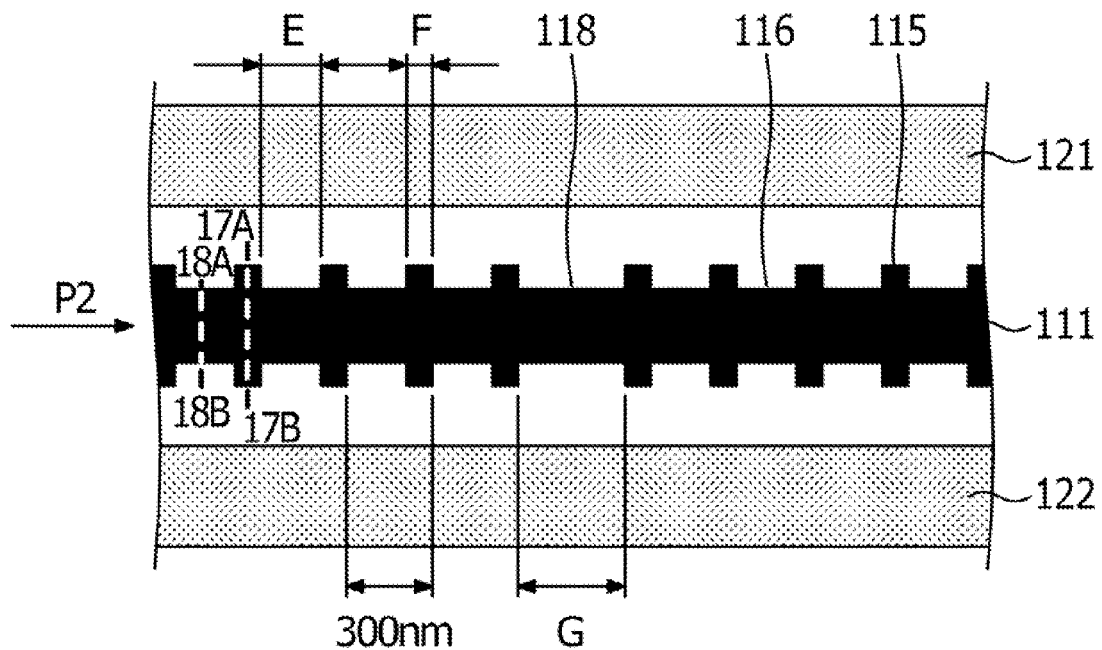
FIG. 16 illustrates an exemplary arm.

FIG. 16 illustrates an exemplary arm. FIG. 16 may be an enlarged view of an essential portion of the first arm 111. The optical waveguide in the first arm 111 includes a diffraction grating region in which a high refractive index region 115 and a low refractive index region 116 are provided alternately, and a λ/4 phase shift region 118. The second arm 112 may be substantially the same as or similar to the first arm 111.

Figure 17:
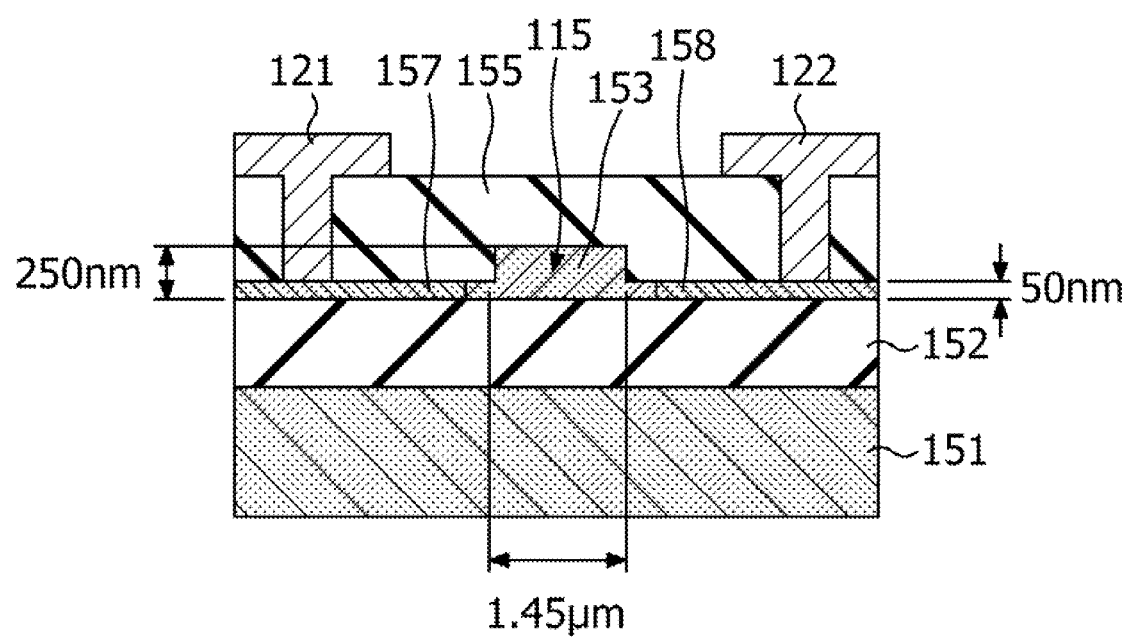
FIG. 17 illustrates an exemplary cross section of a high refractive index region.
Figure 18:
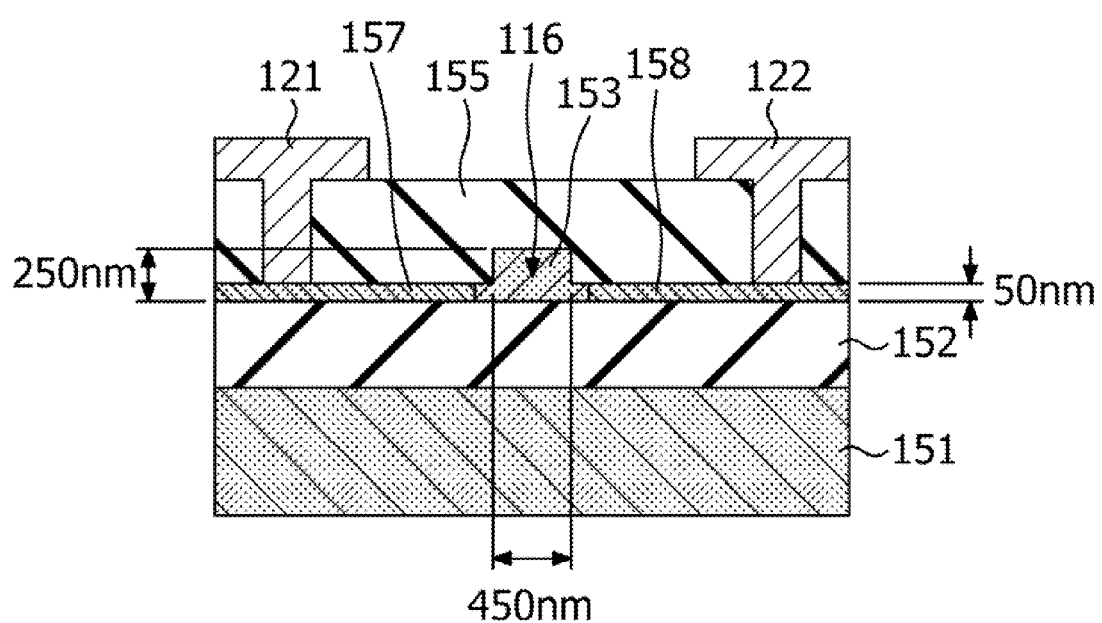
FIG. 18 illustrates an exemplary cross section of a low refractive index region.

FIG. 17 illustrates an exemplary cross section of a high refractive index region. FIG. 18 illustrates an exemplary cross section of a low refractive index region. FIG. 17 may be an illustration of a cross section taken along the broken line 17A-17B illustrated in FIG. 16. FIG. 18 may be an illustration of a cross section taken along the broken line 18A-18B illustrated in FIG. 16. As illustrated in FIGS. 17 and 18, an embedded oxide film 152 including $SiO_2$ is formed on a silicon substrate 151, and a projecting portion 153 including silicon is formed on the oxide film 152. An n-type region 157 and a p-type region 158 are formed on both sides of the projecting portion 153 corresponding to the optical waveguide 110, and an oxide film 155 is formed on the projecting portion 153.

The width of the projecting portion 153 in the high refractive index region 115 may be larger than that in the low refractive index region 116. In the high refractive index region 115 and the low refractive index region 116, an opening is formed in the oxide film 155 on the n-type region 157 so that the electrode 121 including a metal material is coupled to the n-type region 157. Also, an opening is formed in the oxide film 155 on the p-type region 158 so that the electrode 122 including a metal material is coupled to the p-type region 158.

The film thickness of the oxide film 152 may be about 2 µm, and the film thickness of the n-type region 157 and the p-type region 158 may be about 50 nm. The thickness and the width of the high refractive index region 115 may be about 250 nm and about 1.45 µm, respectively. The thickness and the width of the low refractive index region 116 may be about 250 nm and about 450 nm, respectively. The cross-sectional structure of the λ/4 phase shift region 118 may be substantially the same as or similar to the cross-sectional structure of the low refractive index region 115.

The λ/4 phase shift region 118 is provided between the diffraction grating regions where the high refractive index region 115 and the low refractive index region 116 are formed alternately. The optical modulation apparatus may support light with a wavelength of 1.55 µm. For example, in the traveling direction of light indicated by the arrow P2 in FIG. 16, the length E of the high refractive index region 115 may be about 240 nm, and the length F of the low refractive index region 16 may be about 60 nm. The high refractive index region 115 and the low refractive index region 116 may be formed at a cycle of about 300 nm. The length G of the λ/4 phase shift region 118 may be about 390 nm. The length G of the λ/4 phase shift region 118 may be calculated as the sum of the length E of the high refractive index region 115 and one fourth of a length of about 600 nm of the wavelength based on the respective refractive indexes of the high refractive index region 115 and the low refractive index region 116 which corresponds to light with a wavelength of 1.55 µm. The lengths E, F, and G may be different depending on the wavelength used or the like.

The optical modulation apparatus illustrated in FIG. 15 may be used in substantially the same way as the optical modulation apparatus illustrated in FIG. 2, and may be included in the optical modulation/integration apparatus illustrated in FIG. 13 or 14. Other elements of the optical modulation apparatus illustrated in FIG. 15 may be substantially the same as or similar to the elements of the optical modulation apparatus illustrated in FIG. 2.

Figure 19:
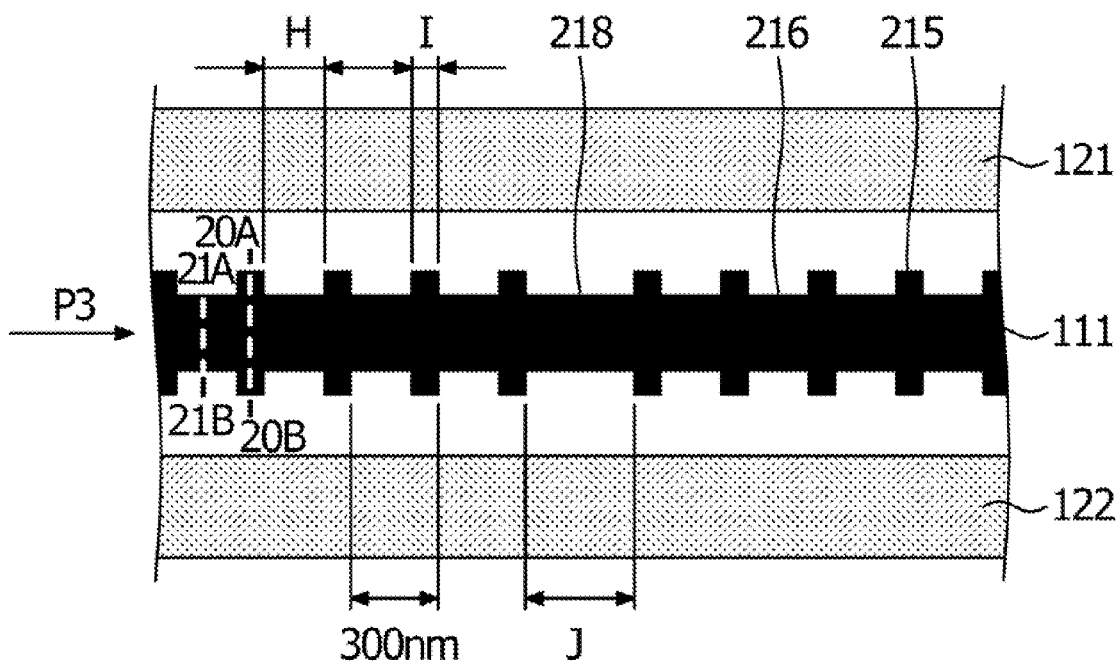
FIG. 19 illustrates an exemplary arm.

FIG. 19 illustrates an exemplary arm. FIG. 19 may be an enlarged view of an essential portion of a region of the optical modulation apparatus in which the optical waveguide in the first arm is formed. The optical waveguide in the first arm includes a diffraction grating region in which a high refractive index region 215 and a low refractive index region 216 are provided alternately, and a λ/4 phase shift region 218. The structure of the second arm may be substantially the same as or similar to the structure of the first arm.

The optical modulation apparatus including the first arm and the second arm illustrated in FIG. 19 may have a MOS structure. An optical waveguide including the first arm and the second arm is formed on a semiconductor substrate. The first arm and the second arm are coupled to a straight optical waveguide region provided on a light incident side, and are coupled to a straight optical waveguide region provided on a light output side. Electrodes that vary the refractive index using an electric field are provided along the first arm and the second arm on both sides of and on top of the first arm and the second arm. A first electrical signal source applies a voltage between the electrodes provided on both sides of the first arm and the electrode provided on top of the first arm to vary the refractive index of the first arm. A second electrical signal source applies a voltage between the electrodes provided on both sides of the second arm and the electrode provided on top of the second arm to vary the refractive index of the second arm.

Figure 20:
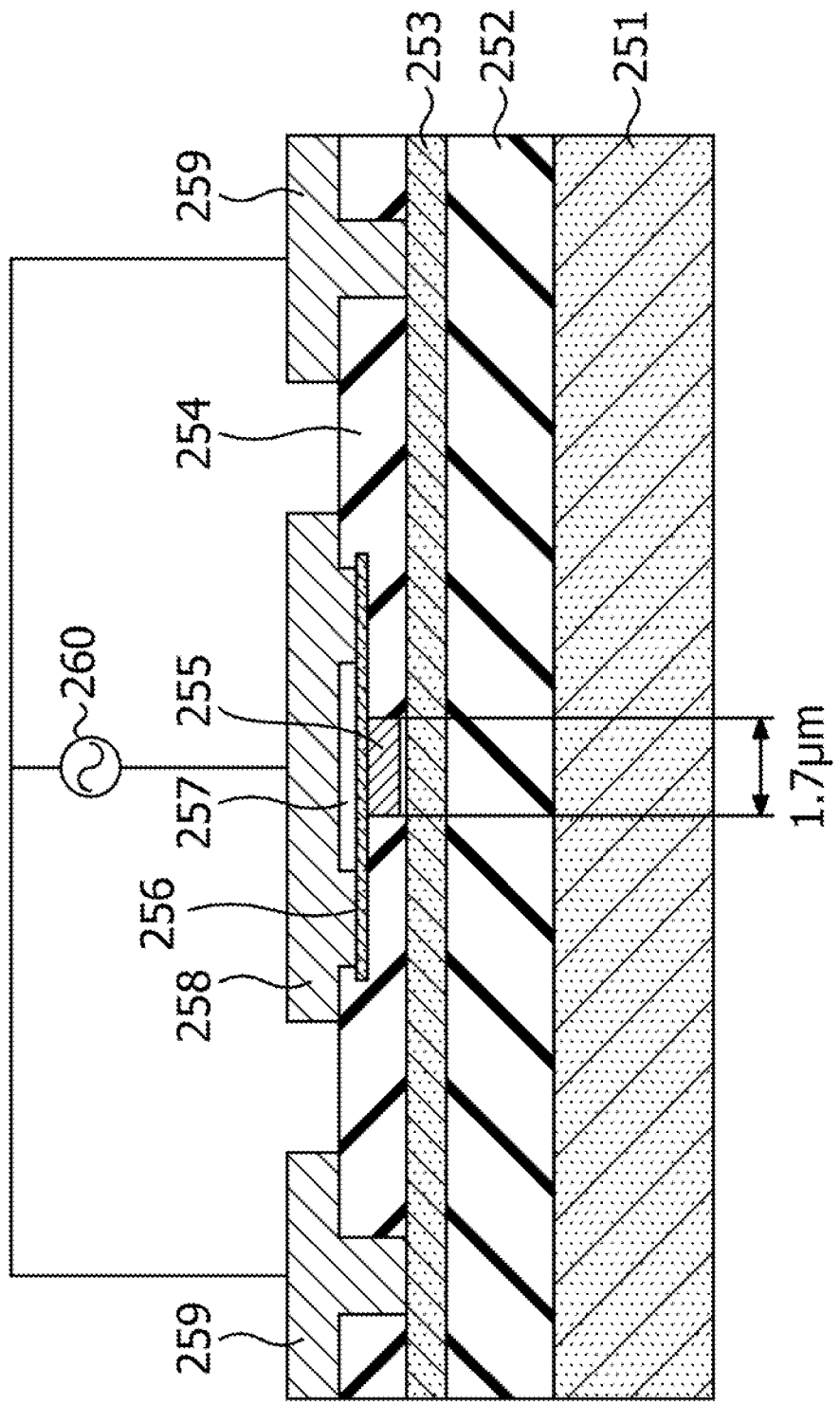
FIG. 20 illustrates an exemplary cross section of a high refractive index region.
Figure 21:
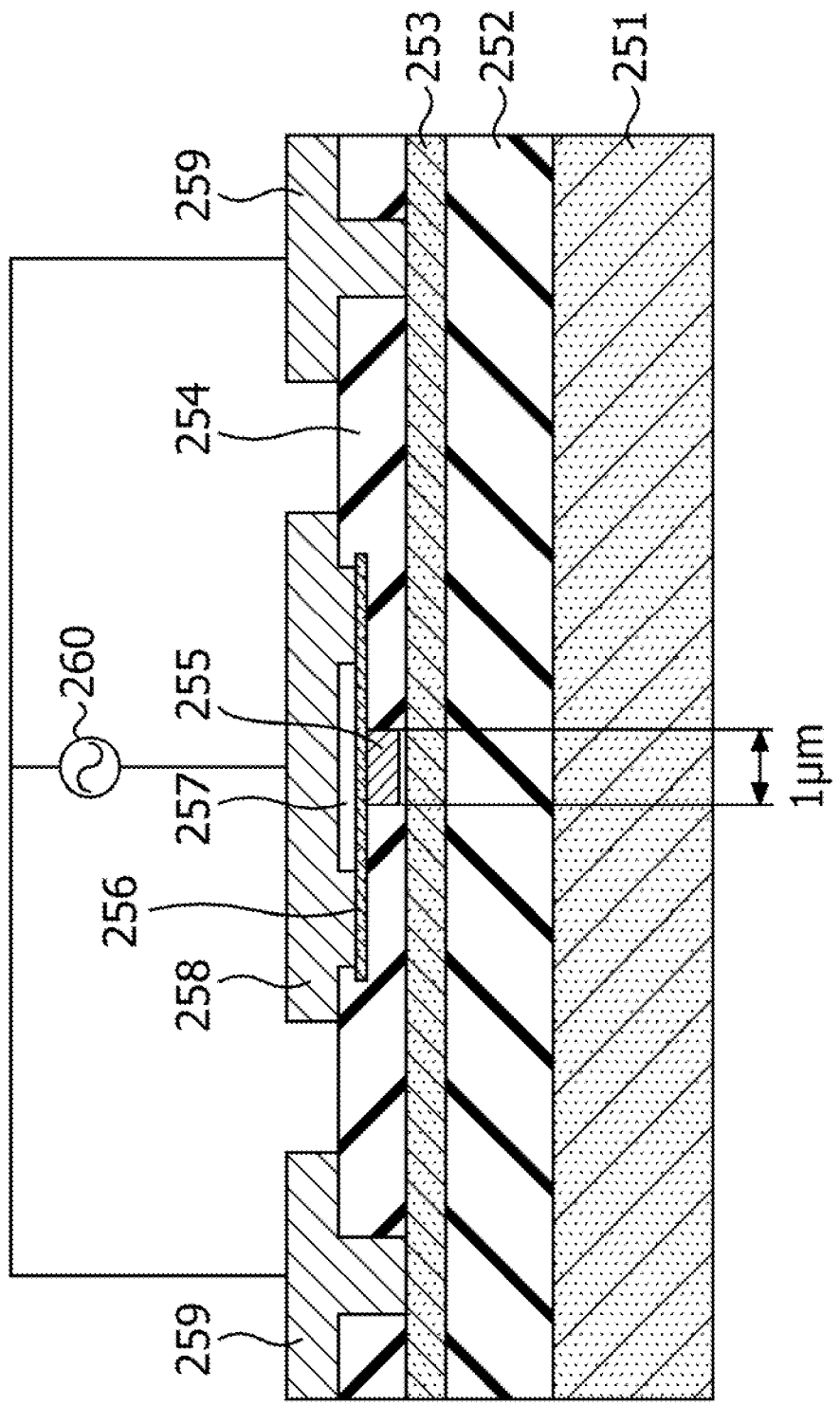
FIG. 21 illustrates an exemplary cross section of a low refractive index region.

FIG. 20 illustrates an exemplary cross section of a high refractive index region. FIG. 21 illustrates an exemplary cross section of a low refractive index region. The cross section illustrated in FIG. 20 may be a cross section taken along the broken line 20A-20B illustrated in FIG. 19. The cross section illustrated in FIG. 21 may be a cross section taken along the broken line 21A-21B illustrated in FIG. 19. An embedded oxide film 252 including $SiO_2$ is formed on a silicon substrate 251, and a silicon layer 253 is formed on the oxide film 252. A p-type region 255 including p-type silicon, a p-type polysilicon region 256, an oxide film 257, and electrodes 258 and 259 including a metal material are formed on the silicon layer 253 via an oxide film 254. An electrical signal source 260 is provided between the electrode 258 and the electrode 259. The electrical signal source 260 may correspond to the first electrical signal source for the first arm, and may correspond to the second electrical signal source for the second arm. The electrode 259 is electrically coupled to the silicon layer 253. The electrode 258 is electrically coupled to the p-type region 256. Application of a voltage performed by the electrical signal source 260 varies the carrier of the p-type region 255, which varies the refractive index.

The film thickness of the oxide film 252 may be about 2 µm, and the film thickness of the silicon layer 253 may be about 1 µm. The film thickness of the p-type region 255 may be about 0.55 µm, and the film thickness of the oxide film 254 between the silicon layer 253 and the p-type region 255 may be 10 nm. The width of the p-type region 255 in the high refractive index region 215 may be 1.7 µm, and the width of the p-type region 255 in the low refractive index region 216 may be 1 µm. The width of the p-type region 255 in the high refractive index region 215 is larger than that in the low refractive index region 216. Incident light is transmitted in the silicon layer 253 via the p-type region 255 and the oxide film 254. The cross-sectional structure of the λ/4 phase shift region 218 may be substantially the same as or similar to the cross-sectional structure of the low refractive index region 216.

The λ/4 phase shift region 218 is provided between the diffraction grating regions where the high refractive index region 215 and the low refractive index region 216 are formed alternately. The optical modulation apparatus may support light with a wavelength of 1.55 µm. For example, in the traveling direction of light indicated by the arrow P3 in FIG. 19, the length H of the high refractive index region 215 may be about 240 nm, and the length I of the low refractive index region 216 may be about 60 nm. The high refractive index region 215 and the low refractive index region 216 may be formed at a cycle of about 300 nm. The length J of the $\lambda/4$ phase shift region 218 may be about 390 nm. The length J of the $\lambda/4$ phase shift region 218 is calculated as the sum of the length H of the high refractive index region 215 and one fourth of a length of about 600 nm of the wavelength based on the respective refractive indexes of the high refractive index region 215 and the low refractive index region 216 which correspond to light with a wavelength of 1.55 µm. The lengths H, I, and J may depend on the wavelength used or the like.

Example embodiments of the present invention have now been described in accordance with the above advantages. It will be appreciated that these examples are merely illustrative of the invention. Many variations and modifications will be apparent to those skilled in the art.

The invention claimed is:

1. An optical modulation apparatus comprising:
a substrate;
a first optical waveguide and a second optical waveguide formed at an interval on the substrate;
an electrode along at least one of the first optical waveguide and the second optical waveguide; and
a power source coupled to the electrode to apply a voltage to at least one of the first optical waveguide and the second optical waveguide,
wherein at least one of the first optical waveguide and the second optical waveguide includes a plurality of diffraction grating regions where light having a wavelength $\lambda$ is reflected, and a phase shift region where a phase of the light is shifted by an amount in a range of 0 to $\lambda/2$, each of the plurality of diffraction grating regions including a high refractive index region and a low refractive index region having a refractive index that is lower than that of the high refractive index region, the phase shift region including a plurality of shift regions, the diffraction grating regions being provided on both sides of one of the plurality of shift regions,
wherein a number of cycles of diffraction gratings in each of a plurality of first diffraction grating regions of the plurality of diffraction grating regions is substantially twice a number of cycles of diffraction gratings in each of a plurality of second diffraction grating regions of the plurality of diffraction grating regions, one of the plurality of second diffraction grating regions being positioned on a far side of an incidence portion and the other of the plurality of second diffraction grating regions being positioned on a far side of an outputting portion,
a first shift region of the plurality of shift regions being positioned immediately next to the one of the plurality of second diffraction grating regions and a second shift region of the plurality of shift regions being positioned immediately next to the other of the plurality of second diffraction grating regions, the remaining plurality of shift regions and the plurality of first diffraction grating regions being arranged immediately alternative to each other between the first shift region and the second shift region.

2. The optical modulation apparatus according to claim 1, wherein the amount of the phase shift includes $\lambda/4$.

3. The optical modulation apparatus according to claim 1, wherein a structure of the diffraction grating region included in the first optical waveguide is substantially the same as a structure of the diffraction grating region included in the second optical waveguide, and a structure of the phase shift region included in the first optical waveguide is substantially the same as a structure of the phase shift region included in the second optical waveguide.

4. The optical modulation apparatus according to claim 1, wherein the diffraction grating region formed between the shift regions includes a plurality of grating regions, and numbers of cycles of the plurality of grating regions formed between the shift regions are substantially the same as each other.

5. The optical modulation apparatus according to claim 1, wherein a sum of a length of the high refractive index region and a length of the low refractive index region in a traveling direction of the light is a length substantially corresponding to $\lambda/2$.

6. The optical modulation apparatus according to claim 5, wherein a cross-sectional shape of the phase shift region is substantially the same as at least one of a shape of a cross section of the high refractive index region taken perpendicularly to the traveling direction of the light and a shape of a cross section of the low refractive index region taken perpendicularly to the traveling direction of the light.

7. The optical modulation apparatus according to claim 1, wherein a length of the phase shift region is substantially equal to a sum of a length generally corresponding to $\lambda/4$ and one of a length of the high refractive index region and the low refractive index region in a traveling direction of the light.

8. The optical modulation apparatus according to claim 1, wherein a material included in the high refractive index region is substantially the same as a material included in the low refractive index region, and a thickness of the optical waveguide in the high refractive index region is substantially larger than a thickness of the optical waveguide in the low refractive index region.

9. The optical modulation apparatus according to claim 1, wherein a material included in the high refractive index region is substantially the same as a material included in the low refractive index region, and a width of the optical waveguide in the high refractive index region is larger than a width of the optical waveguide in the low refractive index region.

10. The optical modulation apparatus according to claim 1, wherein the power source applies a voltage in a direction parallel to a surface direction of the substrate.

11. The optical modulation apparatus according to claim 1, wherein the power source applies a voltage in a direction perpendicular to a surface direction of the substrate.

12. The optical modulation apparatus according to claim 1, wherein the optical modulation apparatus is driven by applying a voltage to one of the first optical waveguide and the second optical waveguide.

13. An optical modulation/integration apparatus comprising:
an optical modulation apparatus; and
a laser to input light to the optical modulation apparatus, wherein the optical modulation apparatus includes:
a substrate; a first optical waveguide and a second optical waveguide formed at an interval on the substrate;
an electrode provided along at least one of the first optical waveguide and the second optical waveguide; and
a power source coupled to the electrode to apply a voltage to at least one of the first optical waveguide and the second optical waveguide,
wherein at least one of the first optical waveguide and the second optical waveguide includes a plurality of diffraction grating regions where light having a wavelength $\lambda$ is reflected, and a phase shift region where a phase of the light is shifted by an amount in a range of 0 to $\lambda/2$, wherein each of the plurality of diffraction grating regions includes a high refractive index region and a low refractive index region having a refractive index that is lower than that of the high refractive index region, the phase shift region including a plurality of shift regions, the diffraction grating regions being provided on both sides of one of the plurality of shift regions, and wherein a number of cycles of diffraction gratings in each of a plurality of first diffraction grating regions of the plurality of diffraction grating regions is substantially twice a number of cycles of diffraction gratings in each of a plurality of second diffraction grating regions of the plurality of diffraction grating regions, one of the plurality of second diffraction grating regions being positioned on a far side of an incidence portion and the other of the plurality of second diffraction grating regions being positioned on a far side of an outputting portion, a first shift region of the plurality of shift regions being positioned immediately next to the one of the plurality of second diffraction grating regions and a second shift region of the plurality of shift regions being positioned immediately next to the other of the plurality of second diffraction grating regions, the remaining plurality of shift regions and the plurality of first diffraction grating regions being arranged immediately alternative to each other between the first shift region and the second shift region.

14. The optical modulation/integration apparatus according to claim 13, wherein the laser includes diffraction gratings.

15. The optical modulation/integration apparatus according to claim 13, comprising:

a distributed bragg reflector (DBR) laser including a third optical waveguide in which a diffraction grating is disposed, wherein the third optical waveguide includes a material that is substantially the same as a material included in the first optical waveguide or the second optical waveguide.

16. The optical modulation/integration apparatus according to claim 15, wherein the third optical waveguide and at least one of the first optical waveguide and the second optical waveguide are formed by monolithic integration.

17. The optical modulation/integration apparatus according to claim 16, wherein a cycle of diffraction gratings in the optical modulation apparatus is substantially the same as a cycle of diffraction gratings in the laser.

\* \* \* \* \*